United States Patent
Nakamura et al.

(10) Patent No.: US 8,232,476 B2
(45) Date of Patent: Jul. 31, 2012

(54) FLEXIBLE MULTILAYER WIRING BOARD

(75) Inventors: Shigehiro Nakamura, Kamisu (JP);
Toshihiko Itou, Kamisu (JP);
Masayoshi Joumen, Kamisu (JP);
Youichirou Mansei, Kamisu (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 110 days.

(21) Appl. No.: 12/527,908

(22) PCT Filed: Feb. 20, 2008

(86) PCT No.: PCT/JP2008/052830
§ 371 (c)(1),
(2), (4) Date: Dec. 9, 2009

(87) PCT Pub. No.: WO2008/102795
PCT Pub. Date: Aug. 28, 2008

(65) Prior Publication Data
US 2010/0084169 A1    Apr. 8, 2010

(30) Foreign Application Priority Data

Feb. 20, 2007 (JP) .............................. P2007-039300
Sep. 26, 2007 (JP) .............................. P2007-250028

(51) Int. Cl.
*H05K 1/00* (2006.01)
*H05K 1/02* (2006.01)

(52) U.S. Cl. ........ 174/254; 174/259; 174/260; 174/256; 361/749; 361/750; 29/832; 29/846; 528/73

(58) Field of Classification Search .......... 174/254–267; 361/732, 737, 743–752, 760–767, 790–797; 257/676, 678, 686, 688–694, 773–778; 156/150, 156/291, 292, 578; 528/59, 73, 125, 289, 528/503; 29/825–852
See application file for complete search history.

(56) References Cited

U.S. PATENT DOCUMENTS 3,817,926 A * 6/1974 Pauze et al. ..................... 528/73
4,182,853 A * 1/1980 Kruh ............................. 528/503
(Continued)

FOREIGN PATENT DOCUMENTS
FR         2427346 A  *  2/1980
(Continued)

OTHER PUBLICATIONS

Translation of the International Preliminary Report on Patentability dated Sep. 3, 2009, for Application No. PCT/JP2008/052830, filed Feb. 20, 2008.

(Continued)

*Primary Examiner* — Michail V Datskovskiy
(74) *Attorney, Agent, or Firm* — Antonelli, Terry, Stout & Kraus, LLP.

(57) ABSTRACT

It is an object of the present invention to provide a flexible multilayer wiring board that can be easily reduced in thickness and that also has sufficient durability against repeated bending or heat shock. A preferred mode of the flexible multilayer wiring board comprises a flexible inner layer board obtained by forming an inner layer wiring on both sides of an insulating layer, an outer layer wiring situated on at least one side of the inner layer board, and insulating adhesive sheets lying between the inner layer board and outer layer wiring. One of the insulating adhesive sheets are composed of an imide group-containing polymer.

9 Claims, 2 Drawing Sheets

U.S. PATENT DOCUMENTS

| | | | | |
|---|---|---|---|---|
| 4,338,149 A | * | 7/1982 | Quaschner | 156/248 |
| 4,342,861 A | * | 8/1982 | Locatelli et al. | 528/59 |
| 4,931,134 A | * | 6/1990 | Hatkevitz et al. | 216/17 |
| 5,206,463 A | * | 4/1993 | DeMaso et al. | 174/254 |
| 5,499,444 A | * | 3/1996 | Doane et al. | 29/830 |
| 6,099,745 A | * | 8/2000 | McKenney et al. | 216/13 |
| 6,288,343 B1 | * | 9/2001 | Ahn et al. | 174/254 |
| 6,617,519 B2 | * | 9/2003 | Wakimoto et al. | 174/254 |
| 6,841,738 B2 | * | 1/2005 | Michiwaki et al. | 174/254 |
| 6,902,949 B2 | * | 6/2005 | Yamazaki et al. | 438/106 |
| 7,642,466 B2 | * | 1/2010 | Nikaido et al. | 174/255 |
| 2008/0047135 A1 | * | 2/2008 | Arnold | 29/829 |

FOREIGN PATENT DOCUMENTS

| | | | | |
|---|---|---|---|---|
| JP | 403262195 A | * | 11/1991 | |
| JP | 5-041580 | | 2/1993 | |
| JP | 407058424 A | * | 3/1995 | |
| JP | 411204896 A | * | 7/1999 | |
| JP | 2002012842 A | * | 1/2002 | |
| JP | 02006032644 A | * | 2/2006 | |
| JP | 02006093647 A | * | 4/2006 | |
| JP | 02006156502 A | * | 6/2006 | |
| JP | 02006173477 A | * | 6/2006 | |
| JP | 2006-196762 | | 7/2006 | |
| JP | 02006202891 A | * | 8/2006 | |
| JP | 2007-013113 | | 1/2007 | |
| JP | 02008300889 A | * | 12/2008 | |
| TW | I224617 | | 12/2004 | |
| TW | 2006-38813 | | 11/2006 | |
| WO | WO 2006/129560 A1 | | 12/2006 | |

OTHER PUBLICATIONS

Taiwanese Official Action dated Mar. 14, 2011, for TW Application No. 097105946.

Japanese Official Action dated Apr. 3, 2012, for JP Application No. 2009-500206.

S. Nakamura, et al., "New Insulation Adhesive Material With Excellent Thermal Resistance", Hitachi Chemical Technical Report, Japan, Hitachi Chemical, Inc., No. 49, Jul. 2007, p. 11-16.

* cited by examiner (a)

(b)

(c)

(d)

(e)

FLEXIBLE MULTILAYER WIRING BOARD

TECHNICAL FIELD

The present invention relates to a flexible multilayer wiring board, and particularly it relates to a flexible multilayer wiring board that has flexibility and comprises a continuously foldable flexible section and a rigid section on which parts can be mounted.

BACKGROUND ART

Electronic devices are rapidly becoming more miniaturized and reduced in weight, while the mounting densities of electronic parts mounted on electronic devices are also increasing. To respond to this trend, a greater variety of properties are being required for electronic parts and the materials composing them.

For example, thinner printed circuit boards are in demand as electronic parts suitable for the smaller and thinner sizes of electronic devices. The demand for thinner sizes can only be met by reducing the total thickness, in the case of a multilayer rigid circuit board, for example. This can be achieved by reducing the thickness of the prepreg that forms the board section.

However, since the prepreg is usually obtained by impregnating a glass cloth with a thermosetting resin such as an epoxy resin, there have been technical limits to thickness reduction. Furthermore, reducing the thickness of a prepreg tends to lower the electrical characteristics such as insulation resistance and migration resistance. In addition, attempting to produce a thin prepreg may result in inconveniences such as uneven thickness.

Printed circuit boards that are increasing in demand include flexible multilayer wiring boards (FPC multilayer wiring boards) and rigid-flex printed circuit boards, which are characterized by being suitable for high-speed signals and allowing a high degree of design freedom in electronic devices. Flexible multilayer wiring boards, in particular, wherein the insulating layer composing the substrate is formed as a film, allow the total thickness to be reduced relatively easily.

Patent document 1 indicated below discloses a multilayer circuit board obtained by laminating an outer layer material made of a flexible base on an inner layer material made of a rigid base. However, while it is possible to reduce the total thickness with such multilayer circuit boards, the lack of flexible sections makes it impossible to obtain an adequate degree of design freedom.

As a multilayer circuit board with an increased degree of design freedom, Patent document 2 indicated below describes a flexible multilayer wiring board comprising a cable section composed of an inner layer board comprising a plurality of conductive layers formed on a flexible insulating layer, and an outer layer wiring section obtained by laminating an outer layer board on the surface of an inner layer board.
[Patent document 1] Japanese Unexamined Patent Publication HEI No. 5-041580
[Patent document 2] Japanese Unexamined Patent Publication No. 2006-196762

DISCLOSURE OF THE INVENTION

Problems to be Solved by the Invention

In recent years, even smaller thicknesses are in demand for printed circuit boards mounted in electronic devices. With the aforementioned conventional flexible multilayer wiring boards, however, the cable sections are exposed to the outside and must therefore be sufficiently protected in order to avoid the effects of the exposure, and this has tended to be an obstacle to further thickness reduction. When the cable sections are reduced in thickness, the protection becomes insufficient and wire breakage can easily occur as a result of deterioration due to repeated bending or deterioration due to exposure to external heat.

The present invention has been accomplished in light of these circumstances, and its object is to provide a flexible multilayer wiring board that can be easily reduced in thickness and that also has sufficient durability against repeated bending or heat shock.

Means for Solving the Problems

In order to achieve this object, the flexible multilayer wiring board of the invention is characterized by comprising a flexible inner layer board obtained by forming an inner layer wiring on both sides of an insulating layer, an outer layer wiring situated on at least one side of the inner layer board, and insulating adhesive sheet lying between the inner layer board and outer layer wiring, wherein at least one of the insulating adhesive sheets consist of an imide group-containing polymer.

The flexible multilayer wiring board of the invention has a structure with a flexible section comprising the inner layer board and having no outer layer wiring and a rigid section comprising the inner layer board and outer layer wiring, wherein bending occurs primarily at the flexible section. In such a structure, the insulating adhesive sheet is formed so as to cover virtually the entire inner layer board positioned on the flexible section and rigid section, and in the rigid section it can function as an adhesive layer with the outer layer wiring.

Since the insulating adhesive sheet of the flexible multilayer wiring board of the invention is composed of an imide group-containing polymer, the extent of deterioration due to bending can be drastically reduced compared to a conventional adhesive layer composed of an epoxy resin or the like. The insulating adhesive sheet is also resistant to deterioration caused by heat, compared to a conventional adhesive layer. Consequently, even if the flexible multilayer wiring board of the invention is repeatedly bent at the flexible section or the flexible section is subjected to heat shock, for example, wire breakage caused by tearing of the insulating adhesive sheet at that section is minimized.

Furthermore, because the insulating adhesive sheet has such properties it can sufficiently protect the inner layer board by itself without providing a separate protective layer at the flexible section. This eliminates the need to provide a protective layer to protect the inner layer board at the flexible section, thus allowing the total thickness of the flexible multilayer wiring board to be reduced.

In other words, the flexible multilayer wiring board of the invention provided with the insulating adhesive sheet described above has a construction characterized by comprising a flexible section with the inner layer board and no outer layer wiring, and a rigid section with both the inner layer board and the outer layer wiring, wherein the insulating adhesive sheet is formed so as to cover both the flexible section and rigid section at least on the side of the inner layer board on which the outer layer wiring is formed, while at the flexible section the inner layer board is covered only by the insulating adhesive sheet.

In the flexible multilayer wiring board of the invention, the inner layer wiring and outer layer wiring of the inner layer board are preferably made of copper foil. Since the inner layer wiring or outer layer wiring made of copper foil has satisfactory flexibility, it is resistant to wire breakage caused by bending of the flexible multilayer wiring board.

Effect of the Invention

Since the flexible multilayer wiring board of the invention has an insulating adhesive sheet made of an imide group-containing polymer, it can exhibit characteristics such that the thickness can be easily reduced and it has sufficient durability against repeated bending or heat shock.

EXPLANATION OF SYMBOLS

Figure 1:
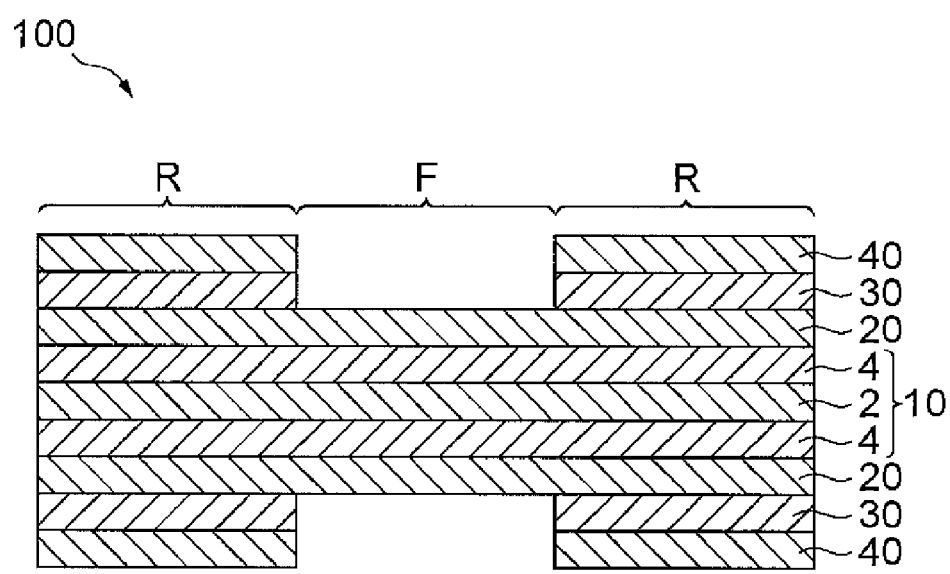
FIG. 1 is a schematic view showing the cross-sectional structure of a flexible multilayer wiring board according to a preferred embodiment.

2: Insulating layer, 4: inner layer wiring, 10: inner layer board, 20: insulating adhesive layer, 30: outer layer wiring, 40: surface resist layer, F: flexible section, R: rigid section.

BEST MODE FOR CARRYING OUT THE INVENTION

Preferred embodiments of the invention will now be explained in detail, with reference to the accompanying drawings. Throughout the explanation of the drawings, corresponding elements will be referred to by like reference numerals and will be explained only once.

(Flexible Multilayer Wiring Board)

FIG. 1 is a schematic view showing the cross-sectional structure of a flexible multilayer wiring board according to a preferred embodiment. The flexible multilayer wiring board 100 shown in FIG. 1 comprises an inner layer board 10, outer layer wirings 30 bonded on either side of the inner layer board 10 via insulating adhesive layers 20, and surface resist layers 40 covering the outer sides of the outer layer wirings 30.

In the flexible multilayer wiring board 100, the outer layer wirings 30 (and surface resist layers 40) are formed partially on the inner layer board 10, the regions on which the outer layer wirings 30 are not formed and the regions on which the outer layer wirings 30 are formed being indicated as the flexible section F and rigid sections R, respectively. The flexible multilayer wiring board 100 bends primarily at the flexible section F, but it may also bend at the rigid sections R.

For clarity in understanding the invention, the inner layer wirings 4 and outer layer wirings 30 are both shown as having laminar cross-sectional structures the drawing, but in actuality they will have prescribed planar pattern shapes and therefore may not exhibit the cross-sectional shape shown in the drawing. For convenience in this embodiment, the flexible section F consists mainly of the discontinuous region without formation of the outer layer wirings, while the rigid sections R consist mainly of the regions on which the outer layer wirings R are continuously formed.

The inner layer board 10 of the flexible multilayer wiring board has a construction with inner layer wirings 4 formed on both sides of an insulating layer 2, and as a whole it has easily bendable flexibility. The insulating layer 2 of the inner layer board 10 is formed of a flexible insulating resin material. The insulating layer 2 is preferably made of polyimide. The inner layer wirings 4 are composed of a conductive material such as a metal that is ordinarily suitable for conductor patterns. From the viewpoint of obtaining satisfactory flexibility for the inner layer board 10, the inner layer wirings 4 are preferably made of copper foil.

The insulating adhesive layers 20 are formed so as to cover the entire regions of both sides of the inner layer board 10. Each insulating adhesive layer 20 functions as a protective layer to protect the inner layer board 10 at the flexible section F, while functioning as an adhesive layer for bonding between the inner layer board 10 and outer layer wiring 30 at the rigid sections R. Each insulating adhesive layer 20 is composed of an insulating adhesive sheet made of an imide group-containing polymer, and it is most preferably made of a polyamideimide which has imide groups and amide groups in the repeating units. The imide group-containing polymer of the insulating adhesive layer 20 will now be explained in detail.

Each outer layer wiring 30 is formed mainly on the rigid sections R of the flexible multilayer wiring board 100, and is bonded to the inner layer board 10 via an insulating adhesive layer 20. Each outer layer wiring 30, like the inner layer wiring 4, is also composed of a conductive material such as a metal that is ordinarily suitable for conductor patterns, and it is more preferably made of copper foil.

The surface resist layer 40 is formed so as to cover the outer layer wiring 30, and functions to protect the outer layer wiring 30. The surface resist layer 40 is not particularly restricted, and for example, it is composed of a resin material with an insulating property, and preferably it is made of an epoxy-based resin film with photosensitivity and an insulating property in order to obtain more excellent protection.

The insulating adhesive layer 20 in the flexible multilayer wiring board 100 having the construction described above is composed of an insulating adhesive sheet made of an imide group-containing polymer. Preferred examples of imide group-containing polymers for the insulating adhesive sheet will now be described.

The imide group-containing polymer is a polymer having at least one imide group in the repeating structure of the polymer, and there may be mentioned polyimides and polyamideimides. Preferred imide group-containing polymers are those with glass transition temperatures of 100-260° C., because these can increase the protective properties of the inner layer board 10 and the adhesion between the inner layer board 10 and outer layer wirings 30.

Polyamideimides are particularly preferred as imide group-containing polymers. Preferred examples of polyamideimides are those obtained by reacting a diimidedicarboxylic acid mixture containing a diimidedicarboxylic acid represented by the following general formula (1a), a diimidedicarboxylic acid represented by the following general formula (1b) and a diimidedicarboxylic acid represented by the following general formula (1c), with an aromatic diisocyanate represented by the following chemical formula (2a), (2b), (2c), (2d) or (2e).

[Chemical Formula 1]

(1a)
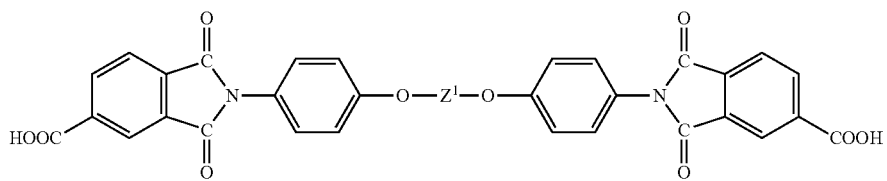

(1b)
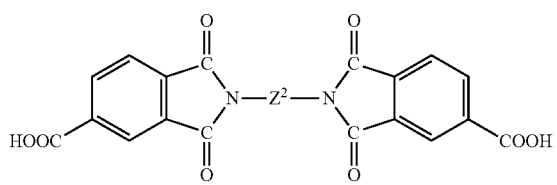

(1c)
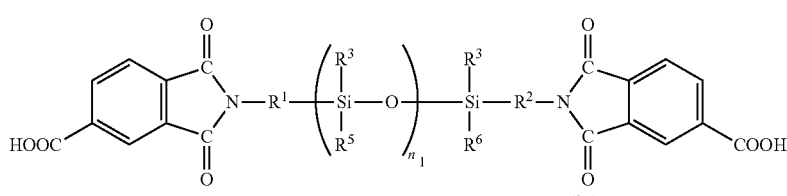

(2a)
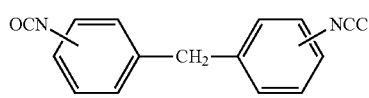

(2b)
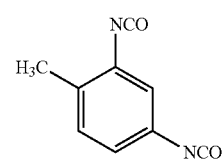

(2c)
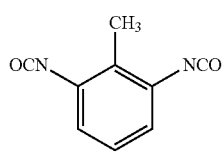

(2d)
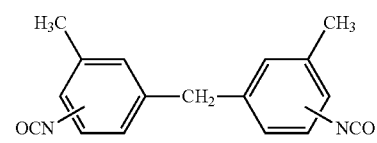

(2e)
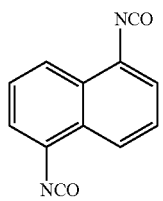

$Z^1$ in formula (1a) is a divalent organic group represented by the following general formula (11), (12), (13), (14), (15), (16), (17) or (18), $Z^2$ in formula (1b) is a divalent organic group represented by the following general formula (21), (22), (23), (24), (25), (26) or (27), $R^1$ and $R^2$ in formula (1c) are each independently a divalent organic group, $R^3$, $R^4$, $R^5$ and $R^6$ are each independently a C1-20 alkyl or C6-18 aryl group, and $n_1$ represents an integer of 1-50.

[Chemical Formula 2]

(11)
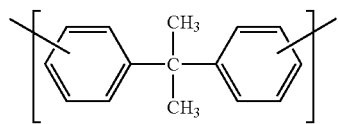

-continued

(12)
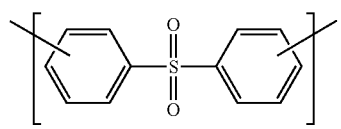

(13)
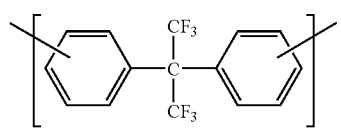

(14)
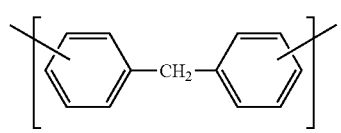

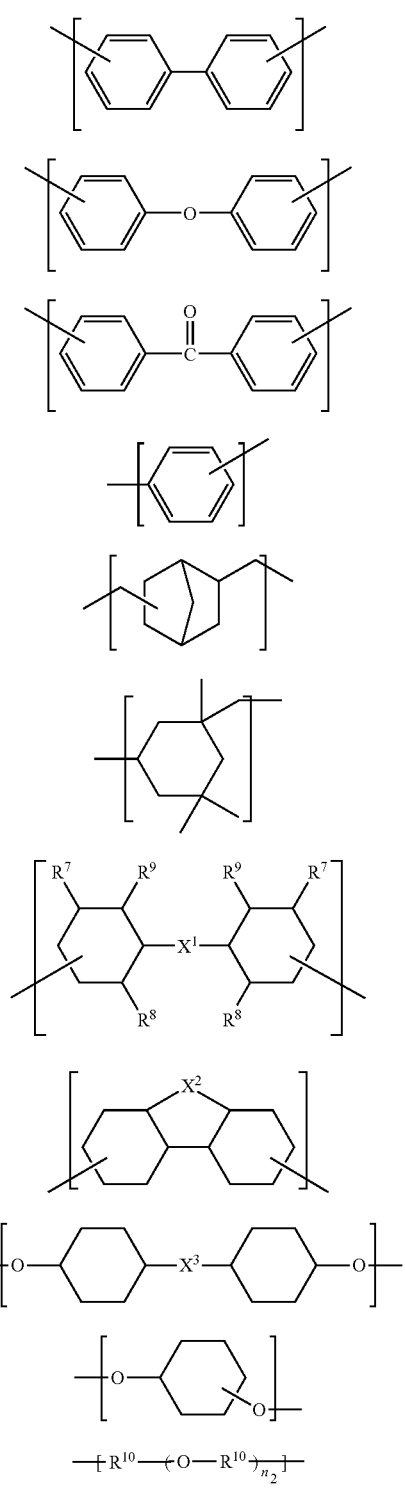

$X^1$ in formula (23) is a C1-3 aliphatic hydrocarbon, C1-3 halogenated aliphatic hydrocarbon, sulfonyl, oxy, carbonyl or single bond, $R^7$, $R^8$ and $R^9$ are each independently hydrogen, hydroxyl, methoxy, methyl or a halogenated methyl group, $X^2$ in formula (24) is a C1-3 aliphatic hydrocarbon, C1-3 halogenated aliphatic hydrocarbon, sulfonyl, oxy or carbonyl group, $X^3$ in formula (25) is a C1-3 aliphatic hydrocarbon, C1-3 halogenated aliphatic hydrocarbon, sulfonyl, oxy, carbonyl or single bond, $R^{10}$ in formula (27) is an alkylene group, and $n_2$ represents an integer of 1-70.

The diimidedicarboxylic acid mixture may be obtained, for example, by reacting a diamine mixture containing a diamine represented by the following general formula (3a), a diamine represented by the following general formula (3b) and a diamine represented by the following general formula (3c), with trimellitic anhydride. $Z^1$, $Z^2$ and $R^1$-$R^6$ in the following general formulas (3a), (3b) and (3c) have the same respective definitions as explained above.

[Chemical Formula 3]

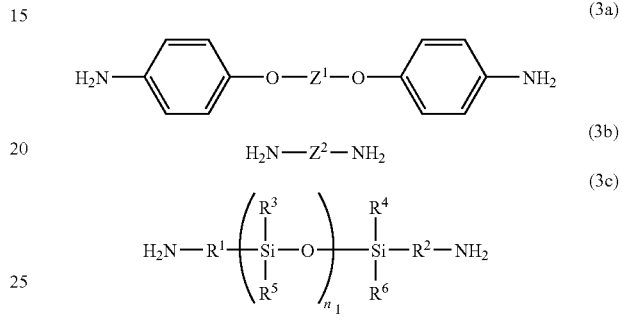

The diamine represented by general formula (3a) above is a diamine with 3 or more aromatic rings. As specific examples there may be mentioned 2,2-bis[4-(4-aminophenoxy)phenyl]propane (hereinafter abbreviated as "BAPP"), bis[4-(3-aminophenoxy)phenyl]sulfone, 2,2-bis[4-(4-aminophenoxy)phenyl]hexafluoropropane, bis[4-(4-aminophenoxy)phenyl]methane, 4,4'-bis(4-aminophenoxy)biphenyl, bis[4-(4-aminophenoxy)phenyl]ether, bis[4-(4-aminophenoxy)phenyl]ketone, 1,3-bis(4-aminophenoxy)benzene, 1,4-bis(4-aminophenoxy)benzene and the like. These may be used alone or in combinations of two or more. Particularly preferred among these is BAPP, from the viewpoint of maintaining balance of properties of the polyamideimide and lowering cost.

As specific examples of diamines represented by general formula (3b) above there may be mentioned polyoxyalkylenediamines such as polyoxypropylenediamine and polyoxyethylenediamine, alkylenediamines such as propylenediamine and hexamethylenediamine, and alicyclic diamines such as 2,2-bis[4-(4-aminocyclohexyloxy)cyclohexyl]propane, bis[4-(3-aminocyclohexyloxy)cyclohexyl]sulfone, bis [4-(4-aminocyclohexyloxy)cyclohexyl]sulfone, 2,2-bis[4-(4-aminocyclohexyloxy)cyclohexyl]hexafluoropropane, bis [4-(4-aminocyclohexyloxy)cyclohexyl]methane, 4,4'-bis(4-aminocyclohexyloxy)dicyclohexyl, bis[4-(4-aminocyclohexyloxy)cyclohexyl]ether, bis[4-(4-aminocyclohexyloxy)cyclohexyl]ketone, 1,3-bis(4-aminocyclohexyloxy)benzene, 1,4-bis(4-aminocyclohexyloxy)benzene, 2,2'-dimethylbicyclohexyl-4,4'-diamine, 2,2'-bis(trifluoromethyl)dicyclohexyl-4,4'-diamine, 2,6,2',6'-tetramethyldicyclohexyl-4,4'-diamine, 5,5'-dimethyl-2,2'-sulfonyl-dicyclohexyl-4,4'-diamine, 3,3''-dihydroxydicyclohexyl-4,4'-diamine, (4,4'-diamino)dicyclohexyl ether, (4,4'-diamino)dicyclohexylsulfone, (4,4'-diaminocyclohexyl)ketone, (3,3''-diamino)benzophenone, (4,4'-diamino)dicyclohexylmethane, (4,4'-diamino)dicyclohexyl ether, (3,3'-diamino)dicyclohexyl ether and 2,2-bis(4-aminocyclohexyl)propane. These may be used alone or in combinations of two or more.

Particularly preferred among the diamines represented by general formula (3b) are polyoxypropylenediamines represented by the following general formula (27'), from the viewpoint of improving the adhesion of the insulating adhesive layer 20, and toughness.

[Chemical Formula 4]

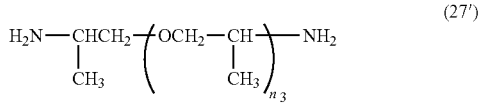

(27')

[In the formula, $n_3$ represents an integer of 1-70]

From the viewpoint of further improving the adhesion of the insulating adhesive layer 20 and toughness, the amine equivalent value of the diamine represented by general formula (3b) above is preferably 50-5000 g/mol and more preferably 100-2000 g/mol.

The diamine represented by general formula (3b) above may be one obtained as a commercially available product. As examples of commercially available products there may be mentioned JEFFAMINE D-230 (trade name of San Techno Chemical Co., Ltd., amine equivalents: 115), JEFFAMINE D-400 (trade name of San Techno Chemical Co., Ltd., amine equivalents: 200), JEFFAMINE D-2000 (trade name of San Techno Chemical Co., Ltd., amine equivalents: 1000) and JEFFAMINE D-4000 (trade name of San Techno Chemical Co., Ltd., amine equivalents: 2000). These may be used alone or in combinations of two or more.

As examples for the divalent organic groups represented by $R^1$ and $R^2$ in general formula (3c) above there may be mentioned alkylene groups such as methylene, ethylene and propylene, and arylene groups such as phenylene, tolylene and xylylene. As examples for the C1-20 alkyl groups in general formula (3c) above there may be mentioned methyl, ethyl, n-propyl, isopropyl, n-butyl, isobutyl, sec-butyl, tert-butyl, pentyl, isopentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, and structural isomers of the foregoing. As examples for the C6-18 aryl groups in general formula (3c) above there may be mentioned phenyl, naphthyl, antholyl and phenantholyl group, which may be further substituted with halogen atoms, amino, nitro, cyano, mercapto, allyl, C1-20 alkyl and the like.

The diamine represented by general formula (3c) above may be one obtained as a commercially available product. As commercially available products there may be mentioned the amino-modified silicone oils X-22-161AS (trade name of Shin-Etsu Chemical Co., Ltd., amine equivalents: 450), X-22-161A (trade name of Shin-Etsu Chemical Co., Ltd., amine equivalents: 840), X-22-161B (trade name of Shin-Etsu Chemical Co., Ltd., amine equivalents: 1500), BY16-853 (trade name of Toray Dow Corning Silicone Co., Ltd., amine equivalents: 650) and BY16-853B (trade name of Toray Dow Corning Silicone Co., Ltd., amine equivalents: 2200). These may also be used alone or in combinations of two or more.

From the viewpoint of further improving the adhesion of the insulating adhesive layer 20, the amine equivalent value of the diamine represented by general formula (3c) above is preferably 400-1500 g/mol, more preferably 600-1100 g/mol and even more preferably 700-900 g/mol. From this viewpoint, X-22-161A (trade name of Shin-Etsu Chemical Co., Ltd., amine equivalents: 840) and X-22-161B (trade name of Shin-Etsu Chemical Co., Ltd., amine equivalents: 1500), for example, are particularly preferred.

The following may be mentioned as examples of aromatic diisocyanates to be reacted with the diimidedicarboxylic acid mixture described above. Specific examples include 4,4'-diphenylmethane diisocyanate represented by chemical formula (2a) above (hereinafter abbreviated as "MDI"), 2,4-tolylene diisocyanate represented by chemical formula (2b) above, 2,6-tolylene diisocyanate represented by chemical formula (2c) above (the diisocyanates represented by chemical formulas (2b) and (2c) will hereinafter be abbreviated as "TDI"), 2,4-tolylene dimer represented by chemical formula (2d) above and naphthalene-1,5-diisocyanate represented by chemical formula (2e) above. These may be used alone or in combinations of two or more.

MDI is preferred among those mentioned above, from the viewpoint of imparting suitable flexibility to the insulating adhesive layer 20 and preventing crystallization of the layer 20. For production of a polyamideimide, an aliphatic diisocyanate such as hexamethylene diisocyanate, 2,2,4-trimethylhexamethylene diisocyanate or isophorone diisocyanate may be added in addition to the aromatic diisocyanate. From the viewpoint of improving the heat resistance of the insulating adhesive layer 20, it is preferred to use an aliphatic diisocyanate at about 5-10 mol with respect to 100 mol of the aromatic diisocyanate.

The polyamideimide in the insulating adhesive layer 20 is preferably produced from the aforementioned starting materials by the production process described below, as an example. Specifically, first a diamine mixture containing the diamines represented by general formulas (3a), (3b) and (3c) above is mixed with trimellitic anhydride (hereinafter, "TMA"), and an aprotic polar solvent is added to the mixture.

Here, the mixing ratio of each diamine, with respect to 100 mol as the total of the diamine mixture, is preferably the following as (3a)/(3b)/(3c): (0.0-70.0) mol/(10.0-70.0) mol/(10.0-50.0) mol, and more preferably (0.0-65.0) mol/(20.0-60.0) mol/(10.0-40.0) mol. If the diamines are not mixed in this mixing ratio, the insulating adhesive layer 20 will tend to warp more easily or the molecular weight of the obtained polyamideimide will be reduced, thus potentially lowering the insulating adhesive layer 20 adhesion and toughness.

The TMA content is preferably 2.05-2.20 mol and more preferably 2.10-2.15 mol with respect to 1 mol of the diamine mixture. If the TMA content is not within this range, the amine mixture or TMA will remain after the reaction, thus tending to lower the molecular weight of the obtained polyamideimide.

The aprotic polar solvent is preferably an organic solvent that does not react with the diamine mixture or TMA. As specific examples there may be mentioned dimethylacetamide, dimethylformamide, dimethyl sulfoxide, N-methyl-2-pyrrolidone, γ-butyrolactone, sulfolane and cyclohexanone. These may be used alone or in combinations of two or more. The reaction will generally be carried out under high-temperature conditions, and N-methyl-2-pyrrolidone is preferably used as a solvent with a high boiling point. The polyamideimide is preferably dissolved in the organic solvent.

The amount of aprotic polar solvent used is preferably 10-80 parts by weight and more preferably 50-80 parts by weight with respect to 100 parts by weight as the total of the diamine mixture and TMA. If it is used at less than 10 parts by weight the TMA will not dissolve sufficiently, and production of diimidedicarboxylic acid will tend to be impaired. The moisture content of the aprotic polar solvent is preferably 0.1-0.2 part by weight. If the moisture content exceeds 0.2 part by weight, the trimellitic acid produced by hydration of TMA will prevent the reaction from proceeding satisfactorily and will lower the molecular weight of the polyamideimide.

The reaction mixture obtained by mixing the starting materials is heated to 50-90° C. and the diamine mixture and TMA are reacted for a period of 0.2-1.5 hours. After the reaction, an aromatic hydrocarbon that can be azeotropically distilled with water is loaded into the solution at a 0.1-0.5 weight ratio with respect to the aprotic polar solvent, and the mixture is heated to 120-180° C. The aromatic hydrocarbon that can be azeotropically distilled with water may be, for example, toluene or xylene. Toluene is preferably used because it has a relatively low boiling point and is non-toxic. Thus, a diimidedicarboxylic acid mixture containing diimidedicarboxylic acids represented by general formulas (1a)-(1c) above is obtained.

Next, an aromatic diisocyanate is added to the mixed solution containing the diimidedicarboxylic acid mixture, and the solution is heated to 150-250° C. for reaction over a period of 0.5-3 hours to form a polyamideimide.

The aromatic diisocyanate content is preferably 1.05-1.50 mol and more preferably 1.1-1.3 mol with respect to 1 mol of the diimidedicarboxylic acid mixture. With a molar ratio of less than 1.05 the polyamideimide will tend to gel, and with a ratio of greater than 0.50 the molecular weight of the obtained polyamideimide will tend to be reduced.

The weight-average molecular weight of the polyamideimide obtained in this manner is preferably 30,000-300,000, more preferably 40,000-200,000 and even more preferably 50,000-100,000. With a weight-average molecular weight of less than 30,000, the insulating adhesive layer 20 strength and flexibility may be reduced. At greater than 300,000, on the other hand, the insulating adhesive layer 20 flexibility and adhesion will tend to be reduced. The weight-average molecular weight referred to here is the value measured by gel permeation chromatography and calculated using a calibration curve prepared using standard polystyrene.

If the insulating adhesive layers 20 in the flexible multilayer wiring board 100 are composed of the aforementioned polyamideimide, the insulating adhesive layers 20 will have excellent adhesion and deterioration caused by bending will also be greatly minimized. The board will also exhibit excellent heat resistance and resistant to heat deterioration as well. Consequently, since the inner layer boards 10 in the flexible multilayer wiring board 100 comprising the insulating adhesive layer 20 described above are protected by the insulating adhesive layers 20 at the flexible section F, provision of a separate protective layer is not necessary and thickness reduction is facilitated. Furthermore, since deterioration of the insulating adhesive layers 20 is minimized even when the flexible section F is repeatedly bent, very little wire breakage occurs at that section and excellent connection reliability is obtained as a result. At the rigid sections R as well, the inner layer boards 10 and outer layer wirings 30 are satisfactorily bonded by the insulating adhesive layers 20.

Since the polyamideimide also exhibits excellent antistatic properties, a flexible multilayer wiring board comprising an insulating adhesive layer 20 made of the polyamideimide can form a printed circuit board characterized by having excellent insulation resistance, thermal conductivity and relative voltage change.

(Process for Producing Flexible Multilayer Wiring Board)

A preferred process for production of a flexible multilayer wiring board according to the aforementioned preferred embodiment will now be described.

Figure 2:
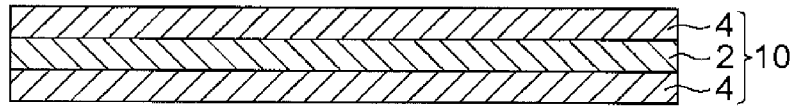
FIG. 2 is a process drawing showing an example of a process for producing a flexible multilayer wiring board.
Figure 2:
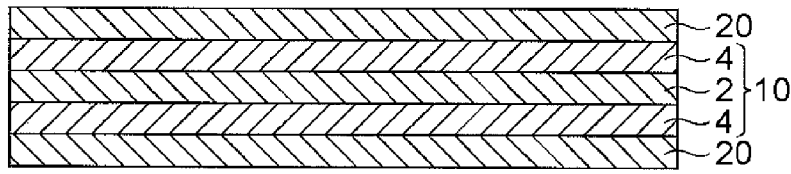
Figure 2:
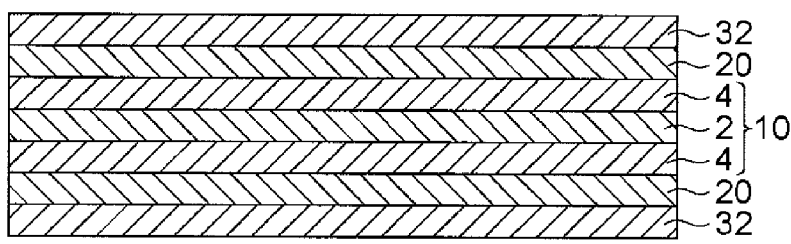
Figure 2:
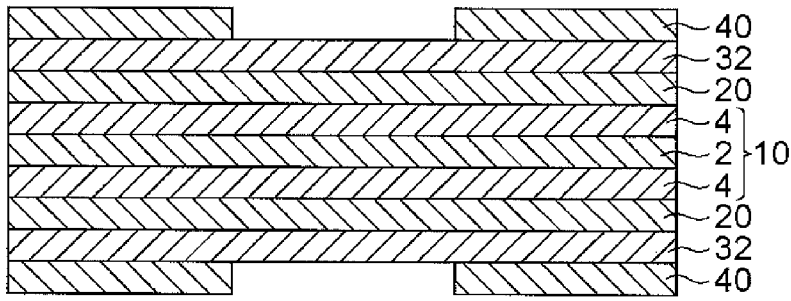
Figure 2:
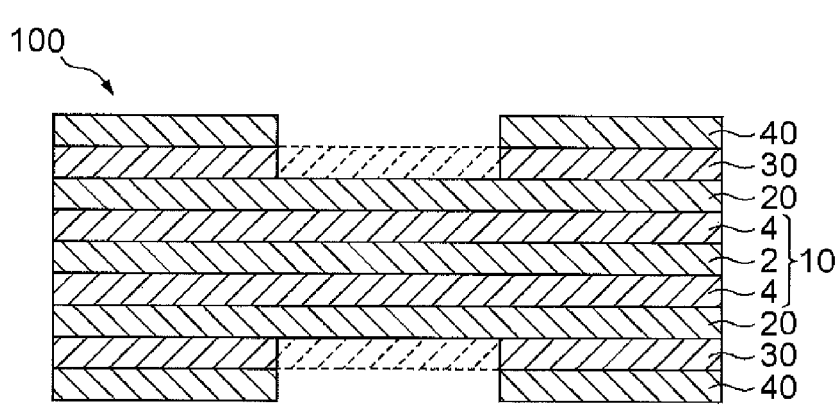

FIG. 2 is a schematic process drawing showing an example of production steps for a flexible multilayer wiring board. For production of the flexible multilayer wiring board, first an insulating layer 2 made of polyimide or the like is prepared. After attaching copper foil or the like onto both sides of the insulating layer 2, the copper foil is patterned by a known method such as photolithography to form inner layer wirings 4, thus obtaining an inner layer board 10 as a double-sided copper-clad flexible printed circuit (FIG. 2(a)).

Next, as shown in FIG. 2(b), insulating adhesive layers 20 are formed on the surface on both sides of the inner layer board 10. The insulating adhesive layers 20 can be formed by forming an insulating adhesive sheet made of an imide group-containing polymer and attaching this to the inner layer board 10. The insulating adhesive sheet may be formed, for example, by preparing a solution of the imide group-containing polymer dissolved or dispersed in a solvent, coating it onto a prescribed support and drying it, and then releasing the support.

After attaching copper foils 32 onto the surfaces of the insulating adhesive layers 20 (FIG. 2(c)), a surface resist layer 40 having a shape corresponding to the pattern shape of the outer layer wiring 30 is formed on each surface of the copper foils 32 (FIG. 2(d)). The surface resist layers 40 are used as masks for etching of the copper foils 32, to remove the copper foils 32 on the regions where the surface resist layers 40 are not formed (FIG. 2(e)). This causes outer layer wirings 30 with prescribed circuit patterns to be formed from the copper foils 32, while removing the copper foils at the flexible section F to expose the insulating adhesive layers 20 at the surface. The regions indicated by the dotted lines in the drawing are the regions removed by etching.

If necessary, rustproofing, or surface treatment such as solder plating or gold plating (not shown) may be carried out at the sections of the external wirings 30 that are exposed as electrodes, to obtain a flexible multilayer wiring board 100 having a structure as shown in FIG. 1.

According to this production process, it is possible to easily obtain a flexible multilayer wiring board 100 wherein outer layer wirings 30 are laminated on both sides of the inner layer board 10 via insulating adhesive layers 20 at the rigid sections R, while the inner layer board 10 is only covered by the insulating adhesive layers 20 at the flexible section F.

Preferred embodiments of the flexible multilayer wiring board and production process of the invention were described above, but the invention is not necessarily limited to these embodiments and may be appropriately modified within ranges that still maintain the gist of the invention.

For example, although the embodiment described above has a construction wherein insulating adhesive layers 20 cover the entirety of the inner layer board 10, it is sufficient if the insulating adhesive layers 20 are formed at least at the flexible section F and rigid sections R of the flexible multilayer wiring board, and for example, when the inner layer board forms lead sections for external connection, the insulating adhesive layers 20 do not need to be formed at those sections. The insulating adhesive layers 20 may also have holes or the like partially formed therein for connection between the inner layer wirings 4 and outer layer wirings 30.

Also, although the flexible multilayer wiring board 100 described above had a construction with one layer each of the outer layer wirings 30 on either side of the inner layer board 10, each of the outer layer wirings 30 may be formed as multiple layers. Alternatively, the outer layer wirings 30 may be formed on only one side of the inner layer board 10 instead of both sides, but in this case at least two layers of the outer layer wiring 30 are preferably formed.

When two or more outer layer wirings 30 are situated on one side of the inner layer board 10 in this way, the outer layer wirings 30 are bonded via an adhesive layer with an insulating property, and the adhesive layer used in this case is also preferably the insulating adhesive layer 20. The insulating layer 2 of the inner layer board 10 may also be composed of the insulating adhesive layer 20.

In addition, in the process for production of the flexible multilayer wiring board 100 described above, the outer layer wirings 30 were formed after forming the insulating adhesive layers 20 on the surfaces of the inner layer board 10, but there is no limitation to this order and for example, the outer layer wirings 30 may be formed first and attached to the inner layer board 10 via insulating adhesive sheets for formation of the insulating adhesive layers 20.

EXAMPLES

The present invention will now be explained in greater detail through the following examples, with the understanding that these examples are in no way limitative on the invention.

Production of Flexible Multilayer Wiring Board

Example 1

Using a flexible printed circuit as the inner layer board, the method of the embodiment described above was followed to attach outer layer wirings composed of electrolytic copper foil to the inner layer board via insulating adhesive sheets composed of an imide group-containing polymer, to obtain a flexible multilayer wiring board having the same structure as shown in FIG. 1. The materials used in the production process were the following.
Inner layer board: Double-sided copper-clad flexible board (Insulating layer: Polyimide film (25 μm thickness, trade name: CAPTONE 100EN, Toray-DuPont Co., Ltd.), inner layer wiring: electrolytic copper foil (12 μm thickness, trade name: F0-WS, Furukawa Circuit Foil Co., Ltd.)).
Outer layer wiring: Electrolytic copper foil (12 μm thickness, trade name: F0-WS, Furukawa Circuit Foil Co., Ltd.)
Insulating adhesive layer: Imide group-containing adhesive sheet (25 μm thickness, trade name: KS7003, Hitachi Chemical Co., Ltd.)

Comparative Example 1

A flexible multilayer wiring board was produced in the same manner as Example 1, except for using the structural materials listed below.
Inner layer board: Double-sided copper-clad flexible board (Insulating layer: Polyimide film (25 μm thickness, trade name: CAPTONE 100EN, Toray-DuPont Co., Ltd.), inner layer wiring: electrolytic copper foil (12 μm thickness, trade name: F0-WS, Furukawa Circuit Foil Co., Ltd.)).
Outer layer wiring: Electrolytic copper foil (12 μm thickness, trade name: F0-WS, Furukawa Circuit Foil Co., Ltd.)
Insulating adhesive layer: Epoxy-based adhesive sheet (80 μm thickness, trade name: AS-3000, Hitachi Chemical Co., Ltd.)
[Evaluation of Physical Properties]
The flexible multilayer wiring boards of Example 1 and Comparative Example 1 obtained as described above were evaluated in terms of their repeated flexibility, interlayer connection reliability, wiring freedom and surface circuit density, according to the following methods. The results are shown in Table 1.

(Repeated Flexibility Test)
Each flexible multilayer wiring board was subjected to an MIT test (based on JIS C6471 8.2). The folding weight in the test was 4.9 N, the folding angle was 135°, the folding radius was R=0.8 mm and the folding cycle was 175 times/min. The number of times folding until a breakage line appeared at the folded section was counted. The results are shown in Table 1. In Table 1, A indicates cases where the number of times folding was 1000 or greater, and B indicates cases where the number of times folding was less than 1000. Table 1 also shows the number of times folding until a breakage line appeared, in parentheses, together with the evaluation results.

(Interlayer Connection Reliability Test)
A gas phase thermal shock test was conducted for each flexible multilayer wiring board. The thermal shock test consisted of treatment with 1000 repeated cycles, where one cycle involved temperature change from 40° C.-125° C. in 60 minutes. The results are shown in Table 1. In Table 1, A indicates cases with no wire breakage at 1000 cycles, and B indicates cases where wire breakage occurred at less than 1000 cycles. Table 1 also shows the number of cycles until wire breakage occurred, in parentheses, together with the evaluation results.

TABLE 1

|  | Example 1 | Comp. Example 1 |
|---|---|---|
| Repeated flexibility | A (1200) | B (800) |
| Interlayer connection reliability | A (1300) | B (600) |

As seen in Table 1, it was confirmed that the flexible multilayer wiring board of Example 1 was superior to the flexible multilayer wiring board of Comparative Example 1 in terms of all of the properties, and especially repeated flexibility and interlayer connection reliability.

The invention claimed is:
1. A flexible multilayer wiring board, comprising
a flexible inner layer board obtained by forming an inner layer wiring on both sides of an insulating layer,
an outer layer wiring situated on at least one side of the inner layer board, and
at least one insulating adhesive sheet lying between the inner layer board and the outer layer wiring,
wherein at least one of the insulating adhesive sheets consists of a polyamideimide obtained by reacting a diimidedicarboxylic acid mixture containing a diimidedicarboxylic acid represented by the following general formula (1a), a diimidedicarboxylic acid represented by the following general formula (1b) and a diimidedicarboxylic acid represented by the following general formula (1c), with an aromatic diisocyanate represented by the following chemical formula (2a), (2b), (2c), (2d) or (2e):

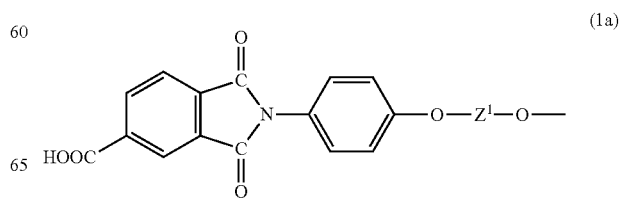

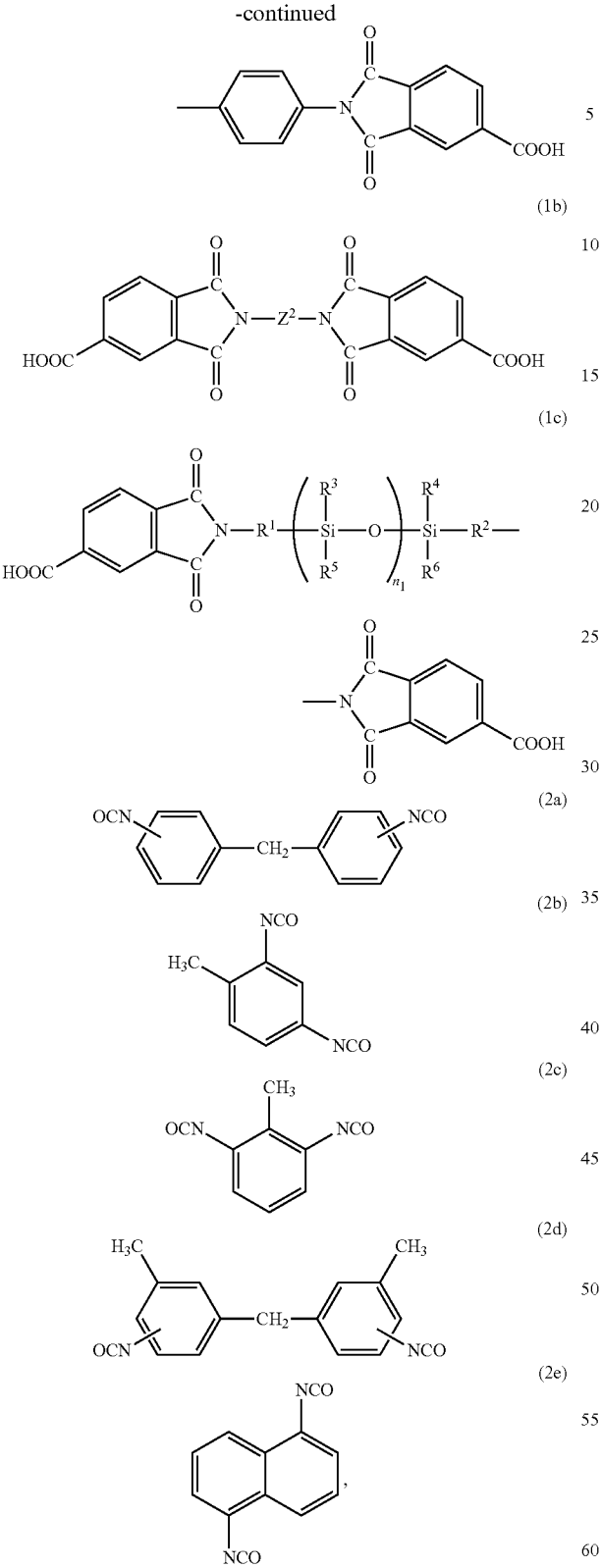

formula (1c) are each independently a divalent organic group, $R^3$, $R^4$, $R^5$ and $R^6$ are each independently a C1-20 alkyl or C6-18 aryl group, and $n_1$ represents an integer of 1-50,

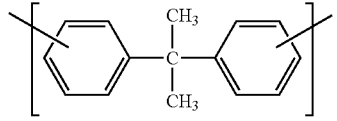   (11)

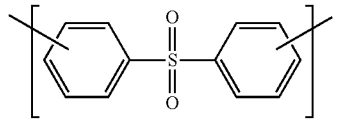   (12)

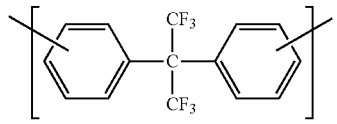   (13)

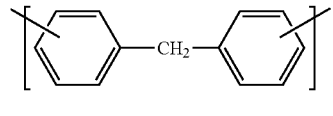   (14)

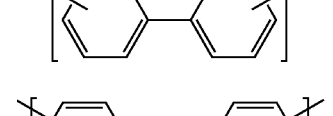   (15)

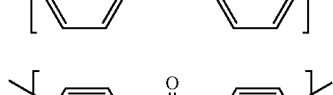   (16)

   (17)

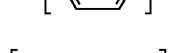   (18)

   (21)

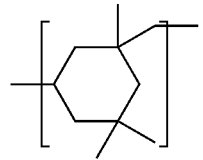   (22)

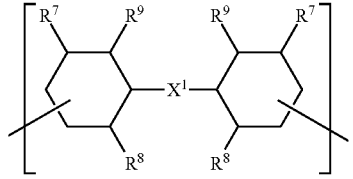   (23)

$Z^1$ in formula (1a) is a divalent organic group represented by the following general formula (11), (12), (13), (14), (15), (16), (17) or (18), $Z^2$ in formula (1b) is a divalent organic group represented by the following general formula (21), (22), (23), (24), (25) or (26), $R^1$ and $R^2$ in -continued

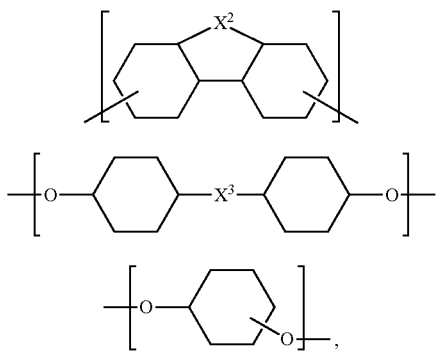

$X^1$ in formula (23) is a C1-3 aliphatic hydrocarbon, C1-3 halogenated aliphatic hydrocarbon, sulfonyl, oxy, carbonyl or single bond, $R^7$, $R^8$ and $R^9$ are each independently hydrogen, hydroxyl, methoxy, methyl or a halogenated methyl group, $X^2$ in formula (24) is a C1-3 aliphatic hydrocarbon, C1-3 halogenated aliphatic hydrocarbon, sulfonyl, oxy or carbonyl group, $X^3$ in formula (25) is a C1-3 aliphatic hydrocarbon, C1-3 halogenated aliphatic hydrocarbon, sulfonyl, oxy, carbonyl or single bond.

2. A flexible multilayer wiring board according to claim 1, characterized by comprising:

a flexible section with the inner layer board and no outer layer wiring, and a rigid section with both the inner layer board and the outer layer wiring, wherein the insulating adhesive sheet is formed so as to cover both the flexible section and rigid section at least on the side of the inner layer board on which the outer layer wiring is formed, while at the flexible section the inner layer board is covered only by the insulating adhesive sheet.

3. A flexible multilayer wiring board according to claim 1, characterized in that the inner layer wiring is composed of copper foil.

4. A flexible multilayer wiring board according to claim 1, characterized in that the outer layer wiring is composed of copper foil.

5. A flexible multilayer wiring board according to claim 2, wherein at the rigid section the insulating adhesive sheet functions as an adhesive layer with the outer layer wiring.

6. A flexible multilayer wiring board according to claim 1, wherein said insulating layer of said flexible inner layer board is made of a polyimide.

7. A flexible multilayer wiring board according to claim 1, further comprising a surface resist layer covering the outer layer wiring.

8. A flexible multilayer wiring board according to claim 7, wherein said surface resist layer is made of an epoxy-based film.

9. A flexible multilayer wiring board according to claim 1, wherein said polyamideimide of the at least one of the insulating adhesive sheets has a glass transition temperature in a range of 100-260° C.

* * * * *